(12) United States Patent
Roohparvar

(10) Patent No.: US 9,582,191 B2
(45) Date of Patent: Feb. 28, 2017

(54) MEMORY BLOCK QUALITY IDENTIFICATION IN A MEMORY

(71) Applicant: MICRON TECHNOLOGY, INC., Boise, ID (US)

(72) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/833,849

(22) Filed: Aug. 24, 2015

(65) Prior Publication Data

US 2016/0048338 A1   Feb. 18, 2016

Related U.S. Application Data

(60) Continuation of application No. 11/601,107, filed on Nov. 17, 2006, now Pat. No. 9,117,553, which is a
(Continued)

(51) Int. Cl.
| | |
|---|---|
| *G11C 29/00* | (2006.01) |
| *G06F 3/06* | (2006.01) |
| *G06F 11/07* | (2006.01) |
| *G11C 29/26* | (2006.01) |
| *G11C 29/44* | (2006.01) |
| *G06F 11/10* | (2006.01) |
| *G11C 29/52* | (2006.01) |
| *G11C 16/04* | (2006.01) |
| *G11C 29/12* | (2006.01) |

(52) U.S. Cl.
CPC ............ *G06F 3/0604* (2013.01); *G06F 3/064* (2013.01); *G06F 3/0631* (2013.01); *G06F 3/0679* (2013.01); *G06F 11/073* (2013.01); *G06F 11/0775* (2013.01); *G06F 11/1068* (2013.01); *G11C 29/26* (2013.01); *G11C 29/44* (2013.01); *G11C 29/52* (2013.01); *G11C 16/04* (2013.01); *G11C 2029/1208* (2013.01); *G11C 2029/4402* (2013.01)

(58) Field of Classification Search
None
See application file for complete search history.

(56) References Cited

U.S. PATENT DOCUMENTS

| | | | |
|---|---|---|---|
| 4,346,459 | A | 8/1982 | Sud et al. |
| 4,380,066 | A | 4/1983 | Spencer et al. |
| | | (Continued) | |

*Primary Examiner* — Daniel McMahon
(74) *Attorney, Agent, or Firm* — Dicke, Billig & Czaja, PLLC

(57) ABSTRACT

Methods of operating electronic systems having a memory include reading indications of memory block quality from a plurality of memory blocks of the memory in which a memory defect has been detected, wherein a value of the indication of memory block quality stored in a respective memory block of the plurality of memory blocks indicates a type of memory defect detected in the respective memory block, and, in response to the values of the indications of memory block quality, deeming a first portion of memory blocks of the plurality of memory blocks as usable, allocating a second portion of memory blocks of the plurality of memory blocks for storing only data of a particular type, and indicating a third portion of memory blocks of the plurality of memory blocks as defective.

20 Claims, 3 Drawing Sheets

Related U.S. Application Data division of application No. 10/983,801, filed on Nov. 8, 2004, now Pat. No. 7,275,190.

(56) References Cited

U.S. PATENT DOCUMENTS

| | | | |
|---|---|---|---|
| 4,564,945 A | 1/1986 | Glover et al. |
| 5,357,473 A | 10/1994 | Mizuno et al. |
| 5,537,488 A | 7/1996 | Menon et al. |
| 5,546,402 A | 8/1996 | Niijima et al. |
| 5,854,796 A | 12/1998 | Sato |
| 5,987,635 A | 11/1999 | Kishi et al. |
| 6,154,851 A | 11/2000 | Sher et al. |
| 6,388,929 B1 | 5/2002 | Shimano et al. |
| 6,405,323 B1 | 6/2002 | Lin et al. |
| 6,445,602 B1 | 9/2002 | Kokudo et al. |
| 6,621,750 B2 | 9/2003 | Okuyama et al. |
| 6,711,056 B2 | 3/2004 | Abedifard et al. |
| 6,781,898 B2 | 8/2004 | Kim et al. |
| 6,792,500 B1 | 9/2004 | Herbst |
| 6,847,565 B2 | 1/2005 | Abedifard et al. |
| 6,871,168 B1 | 3/2005 | Tanaka et al. |
| 6,883,126 B1* | 4/2005 | Herman | G11B 20/18 |
| | | | 714/723 |
| 6,944,063 B2 | 9/2005 | Chen et al. |
| 7,162,668 B2 | 1/2007 | Roohparvar |
| 2001/0032327 A1 | 10/2001 | Lin |
| 2001/0036321 A1 | 11/2001 | Kishi |
| 2003/0080335 A1 | 5/2003 | Koyama |
| 2003/0090943 A1 | 5/2003 | Okuyama et al. |
| 2003/0115518 A1* | 6/2003 | Kleveland | G11C 29/4401 |
| | | | 714/718 |
| 2003/0235092 A1 | 12/2003 | Micheloni et al. |
| 2004/0008549 A1 | 1/2004 | Micheloni et al. |
| 2004/0088614 A1 | 5/2004 | Wu |
| 2004/0153947 A1 | 8/2004 | Beer |
| 2005/0091563 A1* | 4/2005 | Jallamion-Grive | G11C 29/02 |
| | | | 714/733 |

* cited by examiner

MEMORY BLOCK QUALITY IDENTIFICATION IN A MEMORY

RELATED APPLICATIONS

This application is a Continuation of U.S. application Ser. No. 11/601,107, titled "MEMORY BLOCK QUALITY IDENTIFICATION IN A MEMORY DEVICE," filed Nov. 17, 2006, now U.S. Pat. No. 9,117,553, issued on Aug. 25, 2015, which is a Divisional of U.S. application Ser. No. 10/983,801, filed Nov. 8, 2004, now U.S. Pat. No. 7,275,190, issued on Sep. 25, 2007, which are commonly assigned and incorporated herein by reference.

TECHNICAL FIELD OF THE INVENTION

The present embodiments relate generally to memory devices and in particular to flash memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Unlike most semiconductor memory, flash memory devices can be sold with a limited quantity of defective memory blocks. Flash memory devices typically have a scheme to communicate the locations of the defective blocks to a controller or processor.

One such scheme employs markers at specific locations in the defective memory block. The markers are generated during the manufacturing and testing process before being sold to the user. When the user powers-up the memory device, the memory controller would go through these specific locations in memory and track the defective blocks. Since there can be thousands of memory blocks in a typical memory device, this is considerable overhead for the controller to handle.

Another problem with marking memory locations as defective is that if certain locations in a flash memory device are marked as defective, the device might have to be discarded. Additionally, integrated circuit manufacturers have to tag an entire memory block as bad even if it has only one bad bit in the field of 512 bytes. Both of these problems reduce the manufacturer's part yield, thus increasing the cost of the memory devices in an industry operating on slim profit margins.

For the reasons stated above, and for other reasons stated below which will become apparent to those skilled in the art upon reading and understanding the present specification, there is a need in the art for an improved method for handling defective memory blocks in a flash memory device.

DETAILED DESCRIPTION

Figure 1:
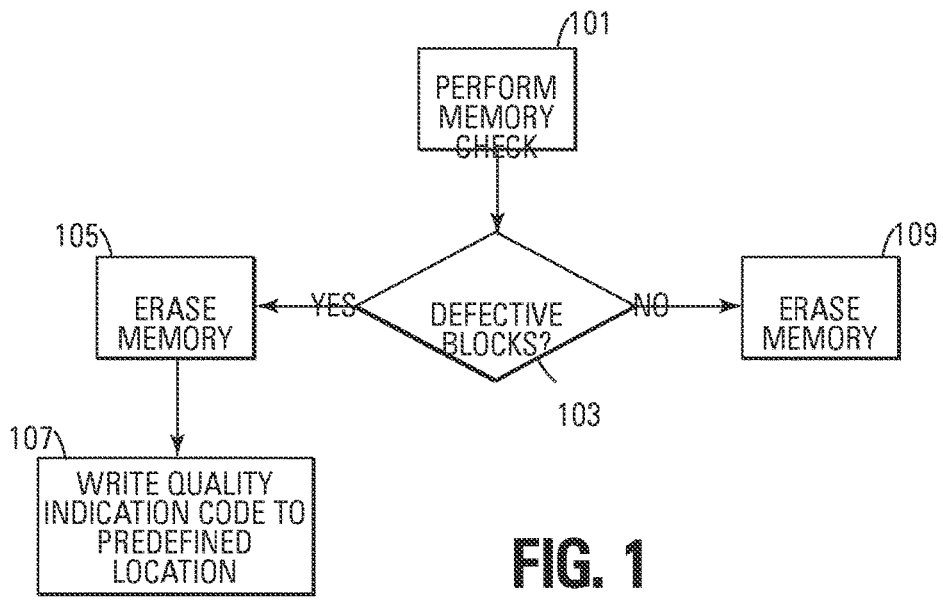
FIG. 1 shows a flowchart of one embodiment of a method for generating a memory block quality indication in a flash memory device.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a flowchart of one embodiment of a method for generating a memory block quality indication in a flash memory device. In one embodiment, this method would be performed during the manufacturing and testing processes at the memory device manufacturer. This reduces the overhead operations required of the memory controller. Alternate embodiments can be performed by the memory controller after the manufacturing process has been completed and the device is being operated by the user.

The method performs a memory check 101 to determine if any defective blocks are present in the memory array. This memory check is well known in the art and can comprise writing a predetermined pattern to the memory cells then reading the data out. If the pattern that was read out does not match what was written, the location is considered defective and the block should be marked as defective. The error detection may also check for bitlines that are shorted together, multilevel cells that have one or more defective bits, or other types of errors. The present invention is not limited to any one error checking routine.

If no defective memory blocks were found 103, the memory device is erased 109 to remove the memory check patterns. This device can then be used in a normal manner.

If defective memory blocks were found 103 during the memory check, the memory blocks can be erased 105 to remove the memory check patterns. However, instead of labeling the memory blocks as defective, unusable blocks, the method of the present invention describes the quality of the defective bits by generating a memory block quality indication.

In one embodiment, each different type of defect is assigned a code. For example, a bad column might be assigned a code of 01H, two bad columns might be assigned a code of 02H, and multiple defective bits in a cell can be assigned a code of 03H. Other defects can be assigned their own particular memory block quality indication code.

In another embodiment, a quality indication code table can be generated that uses a one byte word in which the first four bits indicates the type of error detected and the second four bits indicates the number of cells in the block that are affected by that particular error. For example, an error code of 34H might indicate that multiple defective bits in a cell have been found in four different cells. In still another embodiment, a code can be assigned (e.g., AAH) that indicates that the memory block is so defective as to be unusable. The present invention is not limited to any one particular coding scheme.

The memory block quality indication code is written to a predetermined location in the particular block 107 with the error. In one embodiment, each block has a certain predefined location set aside that is used only for the quality indication code. In another embodiment, the quality indication code for each defective block can be stored in a non-volatile register, separate from the main memory array, with an indication as to which block it pertains.

Figure 2:
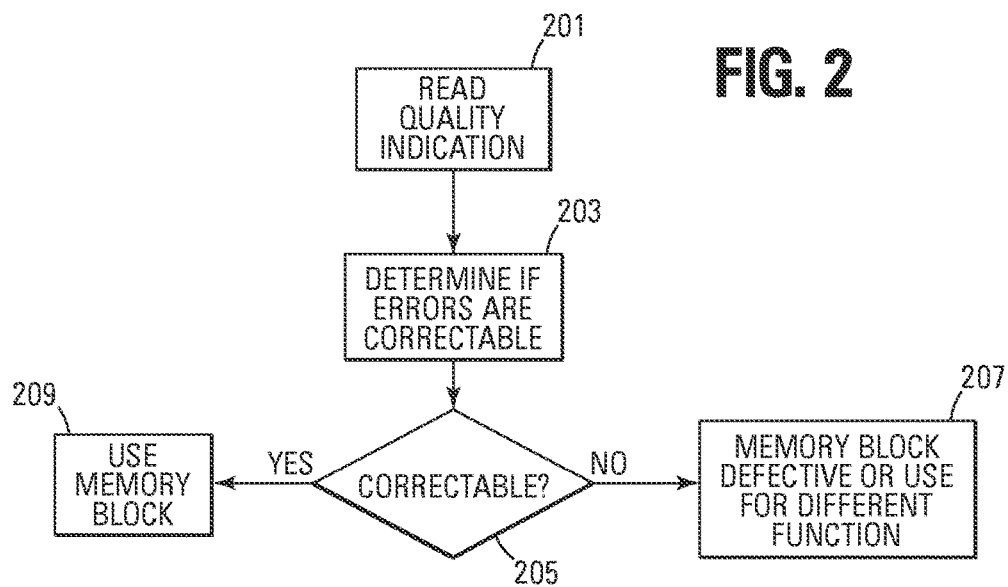
FIG. 2 shows a flowchart of one embodiment of a method for implementing the memory block quality indication of the present invention.

FIG. 2 illustrates a flowchart of one embodiment of a method in which the quality indication code of the present invention is used. A memory device comprising the quality indication code can be used in a system with a processor that executes an error correction code scheme. The system reads the quality indication code as generated previously 201. It can then be determined if any errors resulting from the defective memory can be corrected 203. For example, the system might have a strong ECC scheme and can correct errors. Alternatively, the system may not have an ECC scheme or it may only be a weak scheme.

If the system has a weak ECC scheme 205, data stored in the defective memory locations may not be correctable. In this case, any data pattern other than the erased data pattern (e.g., FFH) found in the block might be considered to be a defective block 207. The block can then be indicated as a defective block using some type of defective block indication scheme or the part may be destroyed. In an alternate embodiment, the system might allocate the defective memory for storing only data (e.g., picture, sound, program code) that will not be affected by the types of errors that might be generated by the defective memory.

If the system has a stronger ECC scheme 205, the ECC might be able to correct most data errors caused by most types of defects in the memory block. In this type of device, the memory block can be used 209 and the system designer might decide to allocate a portion of the ECC correction to the initial defects and another portion of the ECC for memory block failures that occur in the field.

ECC schemes are used to improve the quality of data in systems. ECC schemes are well known in the art and include Reed-Solomon and BCH as well as many others. Reed-Solomon works on groups of bits as opposed to bit level error correction. BCH provides multilevel, cyclic error correction. These and other error detection/correction schemes can provide improved data storage for the embodiments of the present invention.

Flash memory devices that incorporate the embodiments of the memory block quality indication method of the present invention may be manufactured in a NOR architecture, a NAND architecture, or some other type of flash memory. In a NOR configuration, the cells are arranged in a matrix. The gates of each floating gate memory cell of the array matrix are connected by rows to wordlines and their drains are connected to column bitlines. The source of each floating gate memory cell is typically connected to a common source line.

Figure 3:
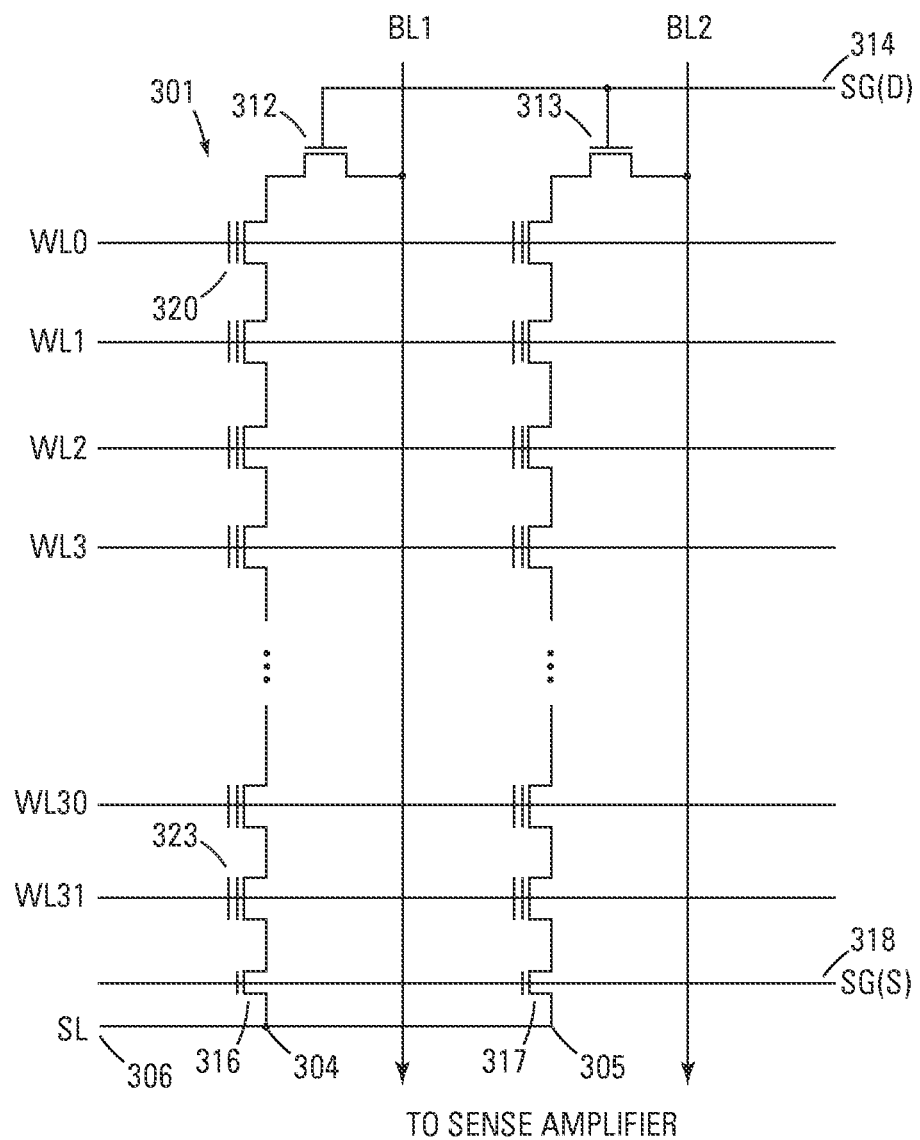
FIG. 3 shows a schematic diagram of one embodiment of a NAND flash memory array of the present invention.

FIG. 3 illustrates a simplified diagram of a typical NAND flash memory array of the present invention. The memory array of FIG. 3, for purposes of clarity, does not show all of the elements typically required in a memory array. For example, only two bitlines are shown (BL1 and BL2) when the number of bitlines required actually depends upon the memory density. The bitlines are subsequently referred to as (BL1-BLN).

The array is comprised of an array of floating gate cells 301 arranged in series strings 304, 305. Each of the floating gate cells 301 are coupled drain to source in each series chain 304, 305. A word line (WL0-WL31) that spans across multiple series strings 304, 305 is coupled to the control gates of every floating gate cell in a row in order to control their operation. The bitlines (BL1-BLN) are eventually coupled to sense amplifiers (not shown) that detect the state of each cell.

In operation, the wordlines (WL0-WL31) select the individual floating gate memory cells in the series chain 304, 305 to be written to or read from and operate the remaining floating gate memory cells in each series string 304, 305 in a pass through mode. Each series string 304, 305 of floating gate memory cells is coupled to a source line 306 by a source select gate 316, 317 and to an individual bitline (BL1-BLN) by a drain select gate 312, 313. The source select gates 316, 317 are controlled by a source select gate control line SG(S) 318 coupled to their control gates. The drain select gates 312, 313 are controlled by a drain select gate control line SG(D) 314.

Each cell can be programmed as a single bit per cell (SBC) or multiple bits per cell (i.e., multilevel cell—MLC). Each cell's threshold voltage ($V_t$) determines the data that is stored in the cell. For example, in a single bit per cell, a $V_t$ of 0.5V might indicate a programmed cell while a $V_t$ of −0.5V might indicate an erased cell. The multilevel cell may have multiple $V_t$ windows that each indicates a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

During a typical prior art programming operation, the selected wordline for the flash memory cell to be programmed is biased with a programming pulse at a voltage that is greater than 16V. A verification operation with a wordline voltage of 0V is then performed to determine if the floating gate is at the proper voltage (e.g., 0.5V). The unselected wordlines for the remaining cells are typically biased at approximately 10V during the program operation. Each of the memory cells is programmed in a substantially similar fashion.

Figure 4:
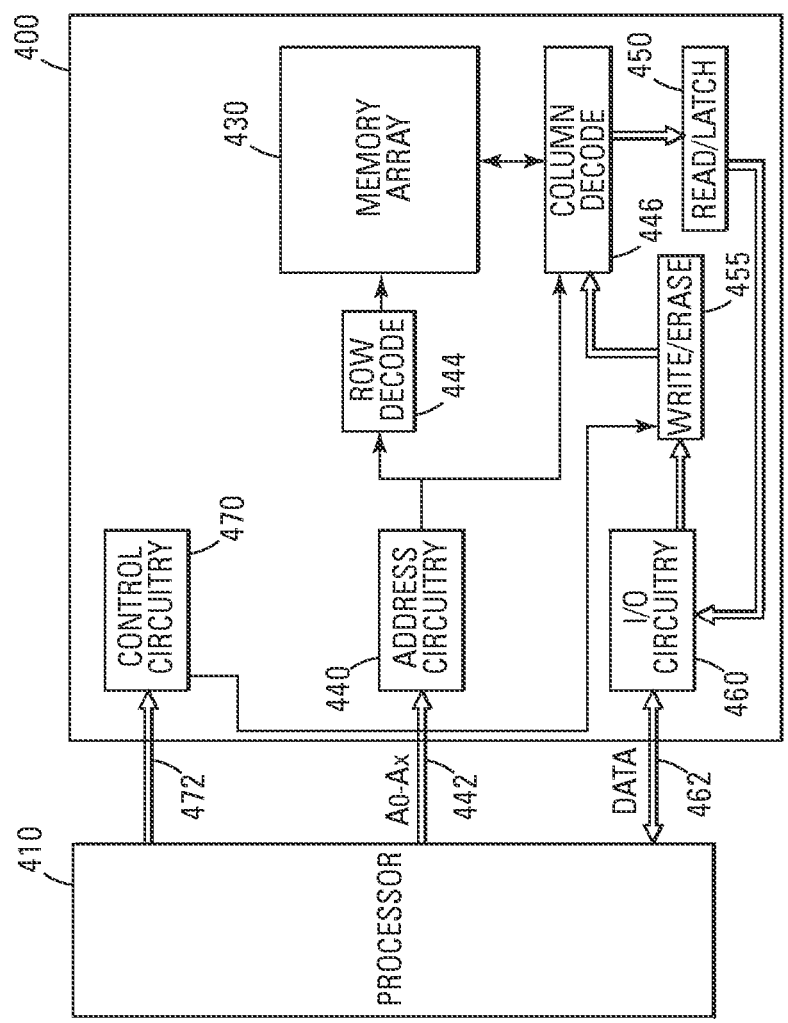
FIG. 4 shows a block diagram of one embodiment of an electronic system of the present invention.

FIG. 4 illustrates a functional block diagram of a memory device 400 that is coupled to a processor 410. The processor 410 may be a microprocessor or some other type of controlling circuitry. The memory device 400 and the processor 410 form part of a memory system 420 of the present invention. The processor 410 is capable of generating memory commands to the memory device 400 as well as executing any ECC scheme that is necessary for a desired operation of the system. The memory device 400 has been simplified to focus on features of the memory that are helpful in understanding the present invention.

The array of flash memory cells 430 may be comprised of the flash memory cells as described previously with reference to FIG. 3. In an alternate embodiment, the memory array 430 is a NOR memory array or some other memory array architecture.

The memory array 430 is arranged in banks of rows and columns. The control gates of each row of memory cells is coupled with a wordline while the drain and source connections of the memory cells are coupled to bitlines. As is well known in the art, the connections of the cells to the bitlines determines whether the array is a NAND architecture or a NOR architecture.

An address buffer circuit 440 is provided to latch address signals provided on address input connections A0-Ax 442. Address signals are received and decoded by a row decoder 444 and a column decoder 446 to access the memory array 430. It will be appreciated by those skilled in the art, with the benefit of the present description, that the number of address input connections depends on the density and architecture of the memory array 430. That is, the number of addresses increases with both increased memory cell counts and increased bank and block counts.

The memory device 400 reads data in the memory array 430 by sensing voltage or current changes in the memory array columns using sense/buffer circuitry 450. The sense/buffer circuitry, in one embodiment, is coupled to read and latch a row of data from the memory array 430. Data input and output buffer circuitry 460 is included for bi-directional data communication over a plurality of data connections 462 with the controller 410. Write circuitry 455 is provided to write data to the memory array.

Control circuitry 470 decodes signals provided on control connections 472 from the processor 410. These signals are used to control the operations on the memory array 430, including data read, data write (program), and erase operations. The control circuitry 470 may be a state machine, a sequencer, or some other type of controller.

The flash memory device illustrated in FIG. 4 has been simplified to facilitate a basic understanding of the features of the memory. A more detailed understanding of internal circuitry and functions of flash memories are known to those skilled in the art.

CONCLUSION

In summary, the embodiments of the memory block quality identification method of the present invention provide a flash memory device with a defective memory block indication that includes the type of defect present in the block. The memory defect quality indication can be generated by the manufacturer and used with the strength of the error correction code of the memory device to determine which defective memory blocks are still usable. Thus the manufacturer may be able to use some memory parts that were previously marked as defective if the system ECC can correct for a particular type of defect in a block.

The memory block quality identification of the present invention also provides a memory user with the option of using a memory device even if ECC is not used. For example, if an end user is storing both program code and other data (e.g., picture or sound data) in the memory device, an error in one of the code bits can cause an entire program to crash while an error in one of the other data bits might not even be noticeable. If a bit fails in the field, the quality indication gives the system the option of deciding whether data or program code is stored in the memory block containing the bad location.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating an electronic system having a memory, comprising:
    reading indications of memory block quality for a plurality of memory blocks of the memory in which a memory defect has been detected, wherein each memory block of the plurality of memory blocks has a respective indication of memory block quality, wherein a value of the indication of memory block quality for its respective memory block of the plurality of memory blocks indicates a memory defect detected in that respective memory block; and
    in response to the values of the indications of memory block quality:
        deeming a first portion of memory blocks of the plurality of memory blocks as usable;
        allocating a second portion of memory blocks of the plurality of memory blocks for storing only data of a particular type; and
        indicating a third portion of memory blocks of the plurality of memory blocks as defective.

2. The method of claim 1, wherein reading indications of memory block quality for a plurality of memory blocks of the memory in which a memory defect has been detected comprises reading an indication of memory block quality from each memory block of the plurality of memory blocks of the memory in which a memory defect has been detected.

3. The method of claim 1, wherein reading indications of memory block quality for a plurality of memory blocks of the memory in which a memory defect has been detected comprises reading the indications of memory block quality from a non-volatile register, and wherein each indication of memory block quality further indicates the memory block of the plurality of memory blocks of the memory to which that indication of memory block quality pertains.

4. The method of claim 1, further comprising:
    determining whether an error correction code scheme applied by the electronic system to the memory is expected to be able to correct data errors resulting from memory defects indicated by the indications of memory block quality;
    wherein deeming the first portion of memory blocks of the plurality of memory blocks as usable is in response to the values of the indications of memory block quality for the first portion of memory blocks indicating that the error correction code scheme is expected to correct data errors resulting from memory defects indicated by the respective values of the indications of memory block quality for the memory blocks of the first portion of memory blocks.

5. The method of claim 1, wherein reading indications of memory block quality comprises reading the indications of memory block quality whose values each indicate both a type of memory defect detected in the respective memory block of that indication of memory block quality and a quantity of memory cells affected by the type of memory defect detected in the respective memory block of that indication of memory block quality.

6. The method of claim 1, wherein deeming a first portion of memory blocks of the plurality of memory blocks as usable comprises deeming as usable those memory blocks of the plurality of memory blocks for which an error correction code scheme applied by the electronic system to the memory is expected to be able to correct data errors resulting from the memory defects indicated by the values of their respective indications of memory block quality.

7. The method of claim 1, wherein allocating a second portion of memory blocks of the plurality of memory blocks for storing only data of a particular type comprises allocating some portion of memory blocks of the plurality of memory blocks for which an error correction code scheme applied by the electronic system to the memory is not expected to be able to correct data errors resulting from the memory defects indicated by the values of their respective indications of memory block quality.

8. The method of claim 7, wherein allocating the second portion of memory blocks of the plurality of memory blocks for storing only data of the particular type comprises allocating the second portion of memory blocks for storing only data of a type that is not expected to be affected by uncorrectable data errors resulting from the memory defects indicated by the values of their respective indications of memory block quality.

9. The method of claim 1, wherein indicating a third portion of memory blocks of the plurality of memory blocks as defective comprises indicating as defective some portion of memory blocks of the plurality of memory blocks for which an error correction code scheme applied by the electronic system to the memory is not expected to be able to correct data errors resulting from the memory defects indicated by the values of their respective indications of memory block quality.

10. The method of claim 9, wherein allocating a second portion of memory blocks of the plurality of memory blocks for storing only data of a particular type comprises allocating a different portion of memory blocks of the plurality of memory blocks for which the error correction code scheme applied by the electronic system to the memory is not expected to be able to correct data errors resulting from the memory defects indicated by the values of their respective indications of memory block quality, and wherein data of the particular type is not expected to be affected by uncorrectable data errors resulting from the memory defects indicated by the values of their respective indications of memory block quality.

11. A method of operating an electronic system having a memory, comprising:
   reading an indication of memory block quality from a particular memory block of the memory in which a memory defect has been detected, wherein a value of the indication of memory block quality indicates the memory defect detected in the particular memory block;
   determining whether an error correction code scheme applied by the electronic system to the memory is expected to be able to correct data errors resulting from the detected memory defect;
   deeming the particular memory block as usable if the error correction code scheme applied by the electronic system to the memory is expected to be able to correct the data errors resulting from the detected memory defect; and
   allocating the particular memory block for storing only data of a particular type if the error correction code scheme applied by the electronic system to the memory is not expected to be able to correct the data errors resulting from the detected memory defect.

12. The method of claim 11, wherein allocating the particular memory block for storing only data of a particular type comprises allocating the particular memory block for storing only data of a type that is not expected to be affected by uncorrectable data errors resulting from the detected memory defect.

13. The method of claim 11, further comprising:
   reading a different indication of memory block quality from a different memory block of the memory in which a memory defect has been detected, wherein a value of the different indication of memory block quality indicates a different memory defect detected in the different memory block;
   determining whether the error correction code scheme applied by the electronic system to the memory is expected to be able to correct data errors resulting from the different detected memory defect;
   deeming the different memory block as usable if the error correction code scheme applied by the electronic system to the memory is expected to be able to correct the data errors resulting from the different detected memory defect; and
   indicating the different memory block as defective if the error correction code scheme applied by the electronic system to the memory is not expected to be able to correct the data errors resulting from the different detected memory defect.

14. A method of operating an electronic system having a memory, comprising:
   reading an indication of memory block quality from a particular memory block of the memory in which a memory defect has been detected, wherein a value of the indication of memory block quality indicates a particular type of memory defect detected in the particular memory block and a quantity of memory cells of the particular memory block affected by the particular type of memory defect;
   determining whether an error correction code scheme applied by the electronic system to the memory is expected to be able to correct data errors resulting from the quantity of memory cells of the particular memory block affected by the particular type of memory defect; and
   allocating the particular memory block for storing only data of a particular type if the error correction code scheme applied by the electronic system to the memory is not expected to be able to correct the data errors resulting from the quantity of memory cells of the particular memory block affected by the particular type of memory defect.

15. The method of claim 14, wherein allocating the particular memory block for storing only data of a particular type comprises allocating the particular memory block for storing at least one type of data selected from a group consisting of picture data and sound data.

16. The method of claim 14, wherein determining whether an error correction code scheme applied by the electronic system to the memory is expected to be able to correct data errors resulting from the quantity of memory cells of the particular memory block affected by the particular type of memory defect comprises determining a strength of the error correction code scheme.

17. The method of claim 14, wherein reading an indication of memory block quality comprises reading the indication of memory block quality having a portion indicating the particular type of memory defect and a different portion indicating the quantity of memory cells affected by the particular type of memory defect.

18. The method of claim 14, wherein reading an indication of memory block quality comprises reading the indication of memory block quality whose value is a particular code indicating both the particular type of memory defect and the quantity of memory cells affected by the particular type of memory defect.

19. A method of operating an electronic system having a memory, comprising:

reading indications of memory block quality from a plurality of memory blocks of the memory in which a memory defect has been detected, wherein each memory block of the plurality of memory blocks has a respective indication of memory block quality having a respective value, wherein the value of the indication of memory block quality for a particular memory block of the plurality of memory blocks indicates a particular type of memory defect detected in the particular memory block;

determining whether an error correction code scheme applied by the electronic system to the memory is expected to be able to correct data errors resulting from memory defects indicated by the indications of memory block quality;

deeming a first portion of memory blocks of the plurality of memory blocks as usable if the error correction code scheme applied by the electronic system to the memory is expected to be able to correct the data errors resulting from the memory defects indicated by the indications of memory block quality for the first portion of memory blocks;

allocating a second portion of memory blocks of the plurality of memory blocks for storing only data of a particular type if the error correction code scheme applied by the electronic system to the memory is not expected to be able to the correct data errors resulting from the memory defects indicated by the indications of memory block quality for the second portion of memory blocks; and indicating a third portion of memory blocks of the plurality of memory blocks as defective if the error correction code scheme applied by the electronic system to the memory is not expected to be able to correct the data errors resulting from the memory defects indicated by the indications of memory block quality for the third portion of memory blocks.

20. The method of claim 19, wherein reading indications of memory block quality comprise reading the indications of memory block quality whose respective values indicate both a type of memory defect detected in its respective memory block and a quantity of memory cells of its respective memory block affected by the type of memory defect detected in its respective memory block.

* * * * *